United States Patent [19]

Hsu et al.

[11] Patent Number: 4,664,944

[45] Date of Patent: May 12, 1987

[54] DEPOSITION METHOD FOR PRODUCING SILICON CARBIDE HIGH-TEMPERATURE SEMICONDUCTORS

[75] Inventors: George C. Hsu, La Crescenta; Naresh K. Rohatgi, W. Corine, both of Calif.

[73] Assignee: The United States of America as represented by the United States Department of Energy, Washington, D.C.

[21] Appl. No.: 824,803

[22] Filed: Jan. 31, 1986

[51] Int. Cl.⁴ .................. B05D 7/00; H01L 21/205
[52] U.S. Cl. .......................... 427/87; 427/95; 427/213; 156/613; 156/DIG. 64; 148/DIG. 148
[58] Field of Search ............ 427/213, 87, 95; 148/DIG. 148; 156/613, DIG. 64

[56] References Cited

U.S. PATENT DOCUMENTS

| | | | |
|---|---|---|---|
| 3,340,110 | 9/1967 | Grabmaier | 148/DIG. 148 |
| 3,520,740 | 7/1970 | Addamiano | 148/DIG. 148 |
| 4,424,199 | 1/1984 | Iya | 427/213 |
| 4,444,811 | 4/1984 | Hsu | 427/213 |

Primary Examiner—John D. Smith
Assistant Examiner—V. D. Dang
Attorney, Agent, or Firm—Judson R. Hightower; Richard E. Constant

[57] ABSTRACT

An improved deposition method for producing silicon carbide high-temperature semiconductor material comprising placing a semiconductor substrate composed of silicon carbide in a fluidized bed silicon carbide deposition reactor, fluidizing the bed particles by hydrogen gas in a mildly bubbling mode through a gas distributor and heating the substrate at temperatures around 1200°–1500° C. thereby depositing a layer of silicon carbide on the semiconductor substrate.

8 Claims, 2 Drawing Figures

DEPOSITION METHOD FOR PRODUCING SILICON CARBIDE HIGH-TEMPERATURE SEMICONDUCTORS

BACKGROUND AND PRIOR ART

The present invention relates to a deposition method for producing silicon carbide (SiC) high temperature semiconductors and more particularly to a method for producing SiC high temperature semiconductor materials using a new fluidized bed deposition system. The articles of epitaxial SiC are formed by deposition on single crystal SiC substrates. The chemical vapor deposition (CVD) in a fluidized bed is practiced with SiC or Si particles, hydrogen gas in a mildly bubbling mode and reactants, such as methyltrichlorosilane or a mixture of $SiH_4/C_3H_8$.

Most semiconductors have been made of pure silicon. These silicon chips, however, are adversely affected by temperatures above 300° C. Semiconductors made of SiC with a large band gap e.g., 2.3 eV for Beta SiC and 2.9 eV for 6H SiC, should be capable of enduring temperatures around 900° C. Such semiconductors could provide the capability to place electronic packages inside turbine engines to monitor and control the engine to a degree never before possible.

Silicon carbide devices would also improve the instrumentation for military aviation, nuclear-powered generators, and other high-temperature environments. Moreover, SiC also appears to be promising as a very high frequency semiconductor. Its refractory nature, inertness and high energy gap allow high power dissipation and superior reliability.

Early silicon carbide efforts were a failure because sufficiently pure crystals of silicon carbide were difficult to make and experimental production methods were not adequate. Presently, there is no one practical process whereby single SiC crystals of sufficient size, purity and perfection could be repeatably grown (see Nieberding, "Researchers Develop Long-Sought SiC Crystal Growth Technique," Industrial Research & Development, P. 148, September 1983). One of the major fundamental problems is the uniformity of deposition. It is difficult to uniformly heat the substrate via inductive coupling through the supporting graphite susceptor in the conventional reactors (see Ban, "Novel Reactor for High Volume Low-Cost Silicon Epitazy," JI. of Crystal Growth, 45, P. 97, 1978). A slight temperature gradient lead to many forms such as polytypes of SiC crystal. Also, the difficulty in maintaining a well-balanced environment and the conditions imposed by a mass-transfer limiting mechanism make it hard to yield a uniform coating.

The most well-known method of making SiC crystals is the chemical vapor deposition (CVD) of volatile silicon and carbon compounds in the presence of hydrogen (See Inomata et al, "Growth of SiC Single Crystals from Silicon Vapor and Carbon," *Silicon Carbide*—1973, P. 133, Proceedings of the 3rd International Conference on SiC, Florida, September 1973, ed. by R. C. Marshall et al., Univ. of So. Carolina Press, and, Wessells et al, "Epitaxial Growth of Silicon Carbide by Chemical Vapor Deposition," *Silicon Carbide*—1973, P. 25, 1973). β-Silicon carbide crystals can be prepared via pyrolysis of gaseous compounds at a heated carbon or silicon substrate around 1500° C. by the so-called van Arkel process (See Knippenberg, "Growth Phenomena in Silicon Carbide," Philips Res. Report 18, No. 3, 161–274, 1963). The product can be either polycrystalline or single crystal, depending upon the size and quality of the substrate. In this type of CVD reactor, as cooler gas flows over the substrate, its leading edge will be at a slightly lower temperatures than the exit edge. This will result in an uneven deposition thickness of different polytypes due to the sensitivity of SiC crystalline structure towards temperature. The nonequivalency of water positions with respect to the gas flow makes it difficult to attain thickness uniformity due to the reactant depletion at downstream positions. The power efficiency is low due to large radiative heat losses from the exposed susceptor surfaces, and the high temperature substrate incurs a large radiation energy loss to the empty surrounding. The throughput for this process is low due to the limitation of reactant concentration in order to prevent the formation of homogeneous fines, which cannot be handled in the conventional CVD type of deposition. The chemical efficiency is low, with some 60–70% of the incoming reactant gas being exhausted unutilized. Moreover, it is a batch process, involving high labor costs.

Other conventional CVD methods are disclosed in U.S. Pat. No. 3,520,740 to Adammiano, U.S. Pat. No. 3,925,577 to Fatzer et al and British Pat. No. 955,700, namely a free-spaced vessel-type process. However, it is difficult to expect to obtain the high temperature semiconductors as that in a fluidized bed of the present invention.

Another well-known method for the production of SiC crystals utilizes sublimation. First, commercial grade silicon carbide is prepared by reacting coal and sand in an electric furnace (See Munch, "Silicon Carbide Technology for Blue-Emitting Diodes," JI. of Electronic Materials, 6, No. 4, P. 449, 1977). Then, the impure hexagonal silicon carbide is purified through a small-scale sublimation technique, invented by Lely, at about 2600° C. Not only is this method of energy intensive and capable only of small scale production because of heat transfer limitations but also the product is frequently contaminated by the impurities in the starting raw SiC material and in the graphite insulation. Because precise control of a process at temperatures as high as 2600° C. is very difficult, SiC crystals grown by sublimation are made up of a mixture of many polytypes. Consequently, the final product usually consists of small, irregularly shaped crystals with unpredictable semiconductor properties.

Another further well-known method for producing SiC crystals utilizes crystallization from solution, e.g. the liquid phase epitaxial. The biggest difficulty here is to contain a silicon/carbon melt at a temperature of several hundred degrees higher than the silicon melting point, i.e. 1800° C. v. 1420° C., without producing any contamination. The materials' problem in a sizable high-temperature liquid container and the associated wall contamination presents intractable difficulties.

Combinations of the above methods have also been used to improve the purity and the quality of resulting crystals. Nevertheless, they all share the inherent drawbacks of extensive energy consumption, and small-scale batch operation. These shortcomings are considered to severely hinder the realization of SiC high-temperature semiconductor technologies on a large-scale.

Accordingly, it is an object of the present invention to overcome the above-noted disadvantages and to provide a fluidized bed deposition system for producing SiC high-temperature semiconductor materials.

Another object of the present invention is to provide a SiC system to yield improved uniform deposition over the conventional CVD reactor.

It is a further object of the present invention to provide a low-cost process for producing large-volume semiconductor-grade SiC crystals.

It is still another object of the present invention to provide time-phased studies on characterizing the structural, chemical, and electrical performances of the deposition of high-temperature semiconductor materials.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

SUMMARY OF THE INVENTION

Briefly described, the present invention relates to a method for the production of a SiC high-temperature semiconductor. A semiconductor substrate composed of SiC is fixed in place in a bed of SiC or Si particles which are fluidized by hydrogen gas in a mildly bubbling mode. The SiC substrate is held, fixed in the fluidized bed with the SiC or Si particles and the substrate heated with an electric current, while the bed particles remain unheated. In this case, the primary function of the seed particles is to carry the mass of deposition to the hot surface of the substrates. Reactants, such as $CH_3SiCl_3$ or a $SiH_4/C_3H_8$ mixture, are introduced at the bottom of the fluidized bed and flow upwardly, thereby causing deposition of a layer of SiC on the fixed semiconductor substrate. The bed particles are made of either Si particles, pure silicon carbide granules or zirconium particles coated with SiC. The particle size ranges will be from about 50–250 $\mu m$. The SiC chemical vapor deposition is coupled with high heat transfer in a fluidized bed operation of which the temperature is expected to be around 1200° C. Heating can be achieved either through a resistance furnace or a capacitance heater. In this manner, cubic SiC crystals deposit on the semiconductor substrate as well as the SiC seed particles, which are both considered products. The products can be withdrawn in a controlled fashion from the fluidized bed. Various configurations of the substrates onto which the SiC is deposited have been used in fluidized bed coatings, including a disc form in a SiC fluidized bed depositor. The thickness of the deposit on the substrate can be controlled by the residence time of the object in the bed.

Various sizes, configurations and techniques in the preparation of the SiC substrate can be used. For example, the SiC substrate can be prepared from a Si/C melt. Starting with a porous carbon matrix kept at a temperature above 1450° C., a carbon-rich Si/C melt is formed in the porous carbon medium. A SiC platelet, apparently crystallized from the Si/C solution is obtained at the interface of the porous carbon medium. The structural form of the crystal can be regulated by controlling the crystallization temperature and the deposition rate. Once the single crystals are formed, the original carbon substrates are removed by heat treatment in oxygen or by chemical etching.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
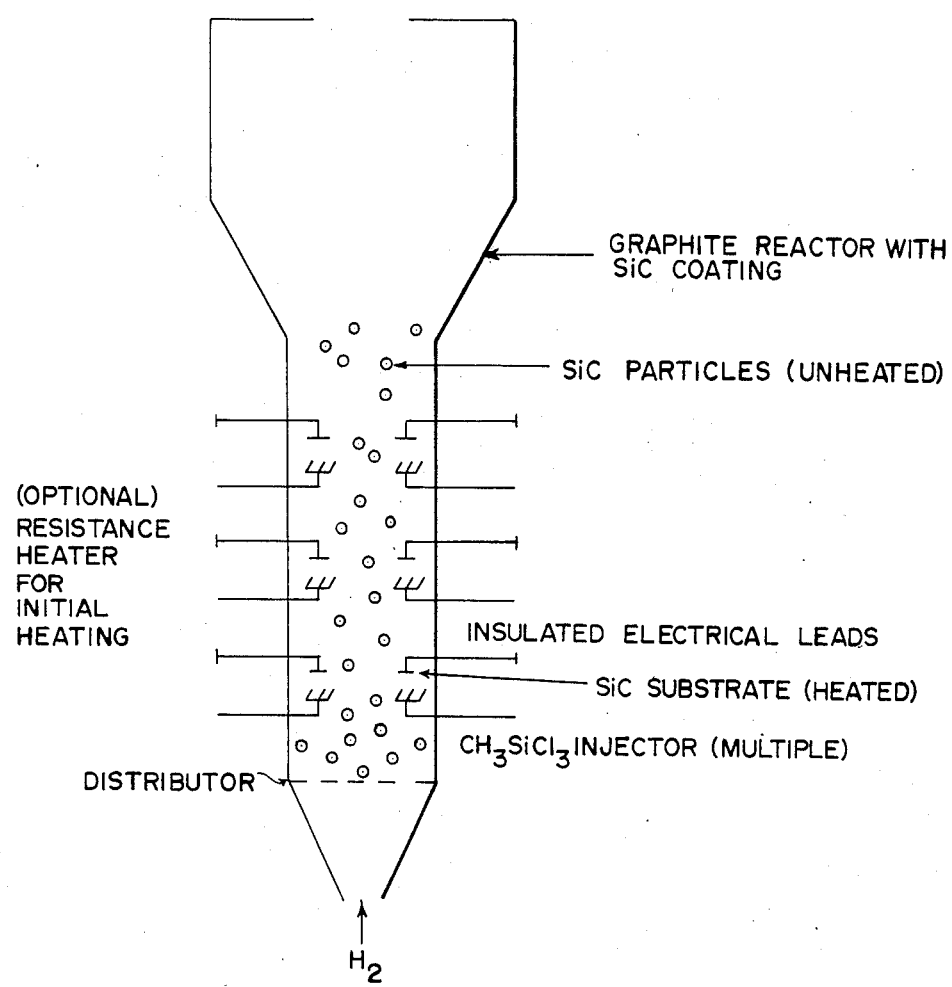
FIG. 1 is a diagramatic representation of an apparatus of a fluidized bed SiC deposition reactor of the present invention.

Referring now in detail to the drawing for the purpose of illustrating the present invention, as shown in FIG. 1, the deposition of the silicon carbide high-temperature semiconductors takes place in a fluidized bed SiC deposition reactor. The fluidized bed reactor is fabricated from a 4-inch ID×4 ft. high graphite tube with an internal coating of SiC. This not only gives matched thermal expansion coefficients for the wall materials of construction but also yields a high-purity environment for SiC crystal growth.

The deposition substrates, of wafer configuration, estimated to have dimensions of 20 mm×20 mm×1 mm, are held fixed in the fluidized bed. They are mounted at various axial locations within the reactors. The bed particles are made of either silicon, pure silicon carbide granules, available commercially, or zirconium oxide particles coated with SiC. The particle size range is from about 50–250 $\mu m$.

At the deposition temperature, around 1400° C., the substrates are heated via electric current through insulated leads or coating, while the bed particles are unheated. This can be achieved by an electric heater, with a potential auxiliary resistance heater. For instance, initially, the temperature of the entire system can be boosted up to a temperature (e.g. 500° C.) below the decomposition temperature of the reactant, (i.e. around 1100° C. for methyltrichlorosilane:$CH_3SiCl_3$) by a resistance heater such as the SiC rod heater. Then, the resistance heater is turned off, and the electric heater is turned on to heat the substrate to 1400° C. while the surrounding particles are unheated. The reactant(s) could be preheated to the vicinity of decomposition temperature of the reactant(s) by a gas preheater which can be simply a packed column of SiC beads, e.g. around 1100° C. for $CH_3SiCl_3$, or heated in the fluidized bed if the initial bed particles are heated. The bed is fluidized by hydrogen gas in a mildly bubbling mode through the gas distributor at the bottom. The concentration range of the methyltrichlorosilane in hydrogen is about 0.5 to 5%.

An alternative heating system is an inductive heater, with the possible assistance of a graphite susceptor coated with SiC beneath the substrate. The main modification in this case is in the use of a quartz reactor instead of graphite tube coated with SiC to let inductive current go through the quartz without heating the wall. Then, the substrate is heated through inductive coupling, but not the particles due to their small size.

The preferred reactant is methyltrichlorosilane ($CH_3SiCl_3$) for its availability, electronic purity, convenient boiling point and because it provides a single component source of silicon and carbon in 1:1 atomic ratio. When it is heated at temperatures around 1200°–1500°

C., SiC is formed on the substrate by the following reaction sequence.

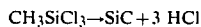
$$CH_3SiCl_3 \rightarrow SiC + 3\, HCl$$

The endothermic reaction at 1500° K. is +42 Kcal/gmole.

The only concern is the potential effect of the reversable etching reaction by the by-product HCl. However, that may only affect the net deposition rate, as SiC deposition from $CH_3SiCl_3$ has been reported in the literature at from 1200° C. to 1500° C.

In an alternate embodiment to avoid the corrosive effect of the HCl system, a mixture of silane $(SiH_4)$/propane $(C_3H_8)$ is provided. Ideally, at a deposition temperature of 1200°–1550° C., the $SiH_4/C_3H_8$ mixtures produces SiC by the following reaction sequence:

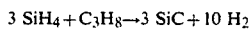
$$3\, SiH_4 + C_3H_8 \rightarrow 3\, SiC + 10\, H_2$$

The endothermic heat of reaction for decomposing propane is +32 Kcal/gmole at 1500° K., and the mildly exothermic heat of reaction for decomposing silane is −5 Kcal/gmole at 1000° K.

Since only the substrates are heated to the deposition temperature, e.g. 1200°–1600° C., the reactant traveling close to the substrates through multiple injection ports, as shown in FIG. 1, will either heterogeneously decompose SiC on the heated substrates or homogeneously decompose in the vicinity of substrates. In this way, the chemical utilization efficiency for the reactant is expected to be high, and the deposition only takes place on the substrates, not in the bulk of the bed. The particles in this case serve to facilitate the mass and heat transfer as well as to keep the coating and gas film temperature around the substrate uniform as stated hereinafter.

To prevent bed temperatures from getting too high, some particles can be removed from a withdrawal boot at the bottom of the reactor. These particles may be cooled externally and recycled back to the reactor as cooled solids.

Figure 2:
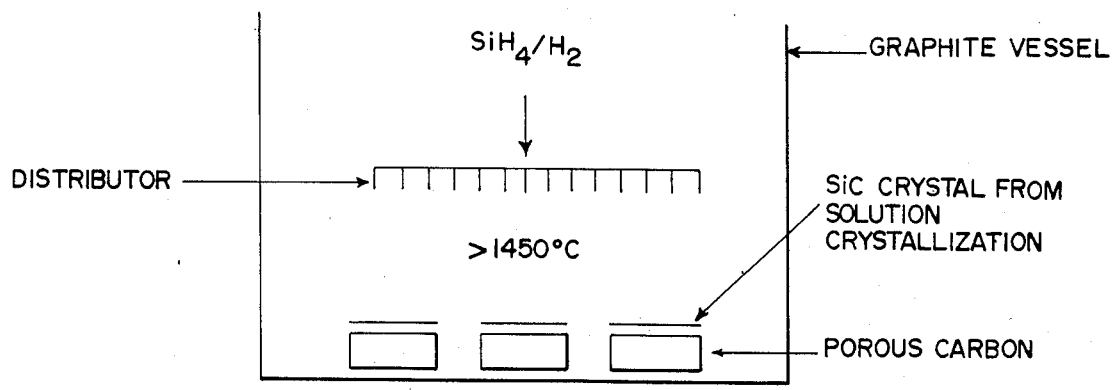
FIG. 2 is a diagramatic representation of a method for preparing a SiC substrate of the present invention.

In the preparation at the laboratory of the SiC substrate via crystallization from a Si/C melt, silane is thermally decomposed into fine silicon powder. The powder diffuses into a porous carbon matrix, which is kept at a temperature above 1450° C. A carbon-rich Si/C melt is formed in the porous carbon medium. A SiC platelet, presumably crystallized from the Si/C solution, is obtained at the interface of the porous carbon medium. This phenomena with the resulting SiC crystal is represented in FIG. 2. The structural form of the crystal is characterized and controlled by the crystallization temperature and the deposition rate. Once the single crystal is formed, the original carbon substrate is removed by heat treatment in oxygen or by chemical etching. There is no molten silicon bulk phase and the temperature of the system is moderate, i.e. about 1450° C., which can be achieved with a simple "picket-fence" type of graphite resistance heater heated by low DC current. The deposition rate of liquid-phase crystallization is about 1 m/min.

The fluidization mode of bed particles is characterized by a gas velocity ratio, $u/u_{mf}$, where u is the superficial gas velocity and $u_{mf}$ is the minimum fluidization velocity. In this case, a mild fluidization of $u/u_{mf} = 1$ to 3 is expected to yield good mixing and gentle smoothing action on the surface deposition. Reactant $CH_3SiCl_3$ is introduced from the multiple injection ports uniformly distributed around the substrates. This and the good solid-gas mixing through the distributor give uniform concentration of the reactant around the substrates, and subsequently result in even deposition and high reactant utilization efficiency. Finally, the exit gas containing HCl is neutralized in a caustic scrubber (not shown) before discharge.

As described above, the present invention is to provide an innovative deposition for SiC high-temperature semiconductor materials, using the fluidized bed deposition scheme. By operating the distributor in a fluidized bed environment, a uniform thermal and mass-transfer field is generated to ensure a uniform deposition.

The major advantages of the fluidized bed depositions are:

(1) Uniform Deposition Thickness—good mixing and mass transfer are the characteristics of a fluidized bed operation. The movement of particles can facilitate the mass transfer from the bulk gas to the substrate surface and reduce the diffusion resistance in the thin film around the substrate. This helps eliminate the uneven deposition due to the difference in diffusion film thickness. This may improve the deposition morphology by shortening the deposition process for a decomposing species to find its way to the lattice site associated with least energy requirement for absorption. Furthermore, the gentle particle movement around the object could help smooth out the deposition thickness.

(2) Uniform Gas Temperature—The bed particles are at a uniform temperature, much lower than the substrates. They are well mixed with gas. Subsequently, gas surrounding the substrate is well mixed as far as temperature and concentration of reactant are concerned. The homogeneous decomposition in that gas film around the substrate is uniform. This helps smooth up any temperature difference on the substrate surface from the gas-side of the heat transfer mechanism.

(3) Uniform Reactor Concentration Environment—This can be achieved by a well-design gas distributor and the utilization of multiple injection of reactant along the reactor axis.

(4) High Throughput (Deposition Rate)—The fluidized bed has been demonstrated to have a unique capability of scavenging fines generated from homogeneous decomposition, if the reactant concentration in the gas stream exceeds the so-called "critical concentration" above which the homogeneous nucleation of fines occurs. The growth is a combination of heterogeneous CVD and homogeneous decomposition which is followed by scavenging/deposition. After the sealing by the CVD reaction, the homogeneous fines give the same dense deposits as the heterogeneous reaction. Thus, higher concentration of reactant can be used in the fluidized bed case than in the conventional CVD reactor. This advantage of a fluidized bed in being able to utilize higher concentration is followed with the primary interest in preserving the crystal quality.

(5) Lower Energy Requirement—The fluidized bed particles are not subject to the extremely high radiation heat loss incurred by high-temperature rod of isolated substrates.

(6) Continuous or Semi-Continuous Operation—Fluidized bed operation is readily suitable to a continuous operation. The substrates can be replaced by a mechanical device through the use of a simple air-lock system. If needed, the bed particles can be withdrawn through a fluidization column.

The invention being thus described, it will be obvious that the same may be varied in many ways, such variations will not be regarded as a departure from the spirit and scope of the invention, and all such modifications as would be obvious to one skilled in the art are intended to be included in the scope of the following claims.

What is claimed is:

1. A deposition method for producing silicon carbide high-temperature semiconductors comprising the steps of:

placing at least one semiconductor substrate composed of silicon carbide in a fluidized bed silicon carbide deposition reactor comprising bed particles, said fluidized bed comprising SiC, Si particles or mixtures thereof;

introducing reactants selected from $CH_3SiCl_3$ or a $SiH_4/C_3H_8$ mixture into said reactor;

fluidizing by hydrogen gas in a mildly bubbling mode through a gas distributor at the bottom of said reactor; and heating said substrate at temperatures around 1200°–1500° C. thereby causing deposition of a layer of silicon carbide on said semiconductor substrate.

2. The method of claim 1, wherein said at least one SiC substrate is heated by an electric current.

3. The method of claim 1, wherein said bed particles range in size from 50–250 μm.

4. The method of claim 1, wherein said reactant comprises methyltrichlorosilane ($CH_3SiCl_3$) and the concentration range of said $CH_3SiCl_3$ in hydrogen is about 0.5–5%.

5. A deposition method for producing silicon carbide high-temperature semiconductors comprising the steps of:

placing at least one semiconductor substrate composed of silicon carbide in a fluidized bed silicon carbide deposition reactor comprising bed particles, said at least one substrate is heated at a deposition temperature, while said bed particles are unheated;

introducing reactants selected from $CH_3SiCl_3$ or a $SiH_4/C_3H_8$ mixture into said reactor;

fluidizing by hydrogen gas in a mildly bubbling mode through a gas distributor at the bottom of said reactor; and heating said substrate at temperatures around 1200°–1500° C. thereby causing deposition of a layer of silicon carbide on said semiconductor substrate.

6. The method of claim 5, wherein said at least one SiC substrate is heated by an electric current.

7. The method of claim 5, wherein said bed particles range in size from 50–250 μm.

8. The method of claim 5, wherein said reactant comprises methyltrichlorosilane ($CH_3SiCl_3$) and the concentration range of said $CH_3SiCl_3$ in hydrogen is about 0.5–5%.

* * * * *